United States Patent
Yang et al.

(10) Patent No.: US 11,731,397 B2
(45) Date of Patent: Aug. 22, 2023

(54) ALLOY-COATED STEEL SHEET AND MANUFACTURING METHOD THEREFOR

(71) Applicants: POSCO, Pohang-si (KR); RESEARCH INSTITUTE OF INDUSTRIAL SCIENCE & TECHNOLOGY, Pohang-si (KR)

(72) Inventors: Ji Hoon Yang, Pohang-si (KR); Jae In Jeong, Pohang-si (KR); Yong Hwa Jung, Pohang-si (KR); Tae Yeob Kim, Pohang-si (KR)

(73) Assignees: POSCO CO., LTD, Pohang-si (KR); RESEARCH INSTITUTE OF INDUSTRIAL SCIENCE & TECHNOLOGY, Pohang-si (KR)

( * ) Notice: Subject to any disclaimer, the term of this patent is extended or adjusted under 35 U.S.C. 154(b) by 14 days.

(21) Appl. No.: 17/217,219

(22) Filed: Mar. 30, 2021

(65) Prior Publication Data

US 2021/0213710 A1 Jul. 15, 2021

Related U.S. Application Data

(63) Continuation-in-part of application No. 16/064,705, filed as application No. PCT/KR2016/015248 on Dec. 23, 2016, now abandoned.

(30) Foreign Application Priority Data

Dec. 24, 2015 (KR) .................. 10-2015-0186261
Apr. 14, 2016 (KR) .................. 10-2016-0045822

(51) Int. Cl.
*B32B 15/01* (2006.01)
*C23C 14/02* (2006.01)
(Continued)

(52) U.S. Cl.
CPC .......... *B32B 15/012* (2013.01); *B32B 15/013* (2013.01); *C22C 21/02* (2013.01);
(Continued)

(58) Field of Classification Search
None
See application file for complete search history.

(56) References Cited

U.S. PATENT DOCUMENTS

| 6,635,359 B1 | 10/2003 | Kurosaki et al. |
| 2006/0177596 A1 | 8/2006 | De Meyer et al. |

(Continued)

FOREIGN PATENT DOCUMENTS

| CN | 1369020 | 9/2002 |
| CN | 103282534 | 9/2013 |

(Continued)

OTHER PUBLICATIONS

Chinese Office Action—Chinese Application No. 201680075926.4 dated Apr. 17, 2020, citing Surface Engineering Manual.
(Continued)

*Primary Examiner* — Daniel J. Schleis
(74) *Attorney, Agent, or Firm* — Cantor Colburn LLP

(57) ABSTRACT

Provided are an alloy coating steel plate and a method of manufacturing the same, and in this case, the alloy coating steel plate includes a steel, and an Al—Mg—Si alloy layer positioned on the steel plate, wherein the Al—Mg—Si alloy layer is formed to include Mg—Si alloy grains in an alloy layer configured in an Al—Mg alloy phase.

2 Claims, 17 Drawing Sheets

(51) Int. Cl.
*C23C 14/16* (2006.01)
*C23C 14/58* (2006.01)
*C22C 21/02* (2006.01)

(52) U.S. Cl.
CPC .......... *C23C 14/022* (2013.01); *C23C 14/16* (2013.01); *C23C 14/5806* (2013.01)

(56) References Cited

U.S. PATENT DOCUMENTS

| | | |
|---|---|---|
| 2012/0129001 A1 | 5/2012 | Schuhmacher et al. |
| 2013/0186524 A1* | 7/2013 | Kwak .................. C23C 14/025 148/531 |
| 2014/0205857 A1 | 7/2014 | Goto et al. |

FOREIGN PATENT DOCUMENTS

| | | |
|---|---|---|
| CN | 104480419 | 4/2015 |
| CN | 104884666 | 9/2015 |
| EP | 1518941 | 3/2005 |
| EP | 2940180 | 11/2015 |
| JP | 06101043 | 4/1994 |
| JP | H06101043 | * 4/1994 |
| JP | 2000290763 | 10/2000 |
| JP | 2001123259 | 5/2001 |
| JP | 2008513595 | 5/2008 |
| JP | 2010229483 | 10/2010 |
| JP | 2012528247 | 11/2012 |
| KR | 20030025068 | 3/2003 |
| KR | 20060073250 | 6/2006 |
| KR | 20120075196 | 7/2012 |
| KR | 20130030768 | 3/2013 |
| KR | 20130074647 | 7/2013 |
| KR | 20140057227 | 5/2014 |
| WO | 2012091345 | 7/2012 |
| WO | 2013008341 | 1/2013 |

OTHER PUBLICATIONS

Chinese Office Action—Chinese Application No. 201680075926.4 dated Sep. 4, 2019, citing CN 103282534, JP 6-101043, JP 2001-123259, KR20030025068, CN104480419, KR20140057227, CN1369020 and CN104884666.

European Office Action—European Application No. 16879428.7, dated Oct. 23, 2020, citing WO 2012/091345 and EP 1518941.

European Search Report—European Application No. 16879428.7, dated Dec. 19, 2018, citing WO 2012/091345, JP H06 101043, EP 2 940 180 and KR 2014 0057227.

Japanese Office Action—Japanese Application No. 2018-533192 dated Aug. 6, 2019, citing WO 2013/008341, JP 2012-528247, JP 2008-513595 and JP 2010-229483.

Surface Engineering Manual, 1998, pp. 624-628.

* cited by examiner (a)            (b)

(a)        (b)

(a)  (b)

ALLOY-COATED STEEL SHEET AND MANUFACTURING METHOD THEREFOR

TECHNICAL FIELD

The present invention relates to an alloy coating steel plate and a method of manufacturing the same.

BACKGROUND ART

Iron is metal that is industrially and most widely used due to abundant resources, excellent characteristic, and low price. Iron is disadvantageously corroded in the atmosphere despite the advantage. Corrosion of iron is a phenomenon in which iron and oxy or water electrochemically react with each other and iron ion is eluted and, when this reaction proceeds, iron oxide (FeOOH) is produced in the eluted part and is referred to as rust. Iron rust includes various stoichiometric oxides and hydroxides and is continuously oxidized over time, which is one of the characteristics of iron. Iron is processed and used in various forms and, in the case of vehicles or a construction material and home appliances, a steel plate that is cold rolled, i.e., a cold rolled steel plate has been mainly used.

As a representative method of preventing a steel plate from being corroded, another metal is plated on a surface of the steel plate. A plated film type is classified into a sacrifice-type film and a block-type film. The sacrifice-type film is formed by covering metal that is easily oxidized and easily gets rusty, such as zinc, magnesium, or aluminum, compared with iron and, in this case, the covered metal is preferentially corroded to protect a steel plate. The block-type film is formed by covering metal that is difficult to corrode, such as lead or tin, compared with a steel plate, to prevent water and oxygen from reaching iron.

Currently, zinc plating has been most widely used to prevent a steel plate from being corroded. After the zinc plating steel plate is developed, various efforts are underway to improve anti-corrosion and, one of these is to cover a zinc alloy. High-anti-corrosion materials using an alloy include Zn—Al, Zn—Ni, Zn—Fe, Zn—Al—Mg, or the like. Such zinc or such a zinc alloy plating steel plate has been widely used in construction materials and home appliances in addition to vehicles.

Aluminum has also been used for anti-corrosion of a steel plate and is used in more various application fields than zinc. An aluminum film has aesthetical color and excellent anti-corrosion and heat resistance and, thus, has been used in coating of a conductive film of a semiconductor, a protective film of a magnetic material or a steel plate, a home appliance of a thermal system, or a vehicle silencer as well as in a film for ornamental purposes, such as a cosmetics case or an accessory.

An aluminum film is manufactured via a vacuum coating, electro plating, or fusion plating method. However, electro plating has degraded producibility due to low efficiency and, thus, mostly uses a fusion plating method and a vacuum coating method.

An aluminum plating steel plate has excellent anti-corrosion and, on the other hand, when a film becomes defective, the defective portion is disadvantageously and intensively corroded because aluminum has degraded sacrifice-type characteristic compared with zinc. Accordingly, the fusion aluminum plating steel plate has a high thickness equal to or 15 micron (μm) to overcome this problem. The fusion aluminum plating steel plate is also processed at high temperature and, thus, workability is disadvantageously degraded while an Al—Fe—Si alloy is formed at an interface.

An aluminum film using vacuum coating has been applied with a low thickness in most uses and, in the case of anti-corrosion coating, coating is generally performed with a thickness of several microns. In the case of the aluminum film, when a thickness is equal to or less than several microns, red rust is generated over above 72 hours in a salt spray test. Accordingly, there is a need to improve the characteristic of aluminum to apply aluminum to a steel plate via anti-corrosion coating. In addition, aluminum has degraded sacrifice-type characteristic compared with zinc and, thus, when red rust is generated once, red rust is disadvantageously and entirely spread for a short time.

Accordingly, there is a need for an urgent research to overcome the above problem.

DISCLOSURE

Technical Problem

The present invention has been made in an effort to provide an alloy coating steel plate and a method of manufacturing the same having advantages of forming a sacrifice-type alloy film on a steel plate to obtain high anti-corrosion characteristic even in a small thickness.

Technical Solution

According to an embodiment of the present invention, an alloy includes a steel plate, and an Al—Mg—Si alloy layer positioned on the steel plate, wherein the Al—Mg—Si alloy layer is formed to include Mg—Si alloy grains in an alloy layer configured in an Al—Mg alloy phase.

The Al—Mg alloy phase may include $Al_3Mg_2$.
The Mg—Si alloy grains may include $Mg_2Si$.
The Mg—Si alloy grains may be amorphous.
Content of Mg—Si alloy grains in the Al—Mg—Si alloy layer may be 1 wt % or more and 70 wt % or less based on 100 wt % of the total weight of the Al—Mg—Si alloy layer.

The alloy coating steel plate may further include an Al—Fe—Si alloy layer positioned between the steel plate and the Al—Mg—Si alloy layer.

The alloy coating steel plate may further include an Mg layer or an Al—Mg alloy layer positioned on the Al—Mg—Si alloy layer.

According to another embodiment of the present invention, a method of manufacturing an alloy coating steel plate includes preparing an aluminum plating steel plate including a plating layer including Al and Si positioned on a steel plate, forming an Mg coating layer by coating Mg on the aluminum plating steel plate, and performing heat treatment on the aluminum plating steel plate with Mg coated thereon to diffuse Mg into the plating layer, wherein the alloy coating steel plate includes a steel plate, and an Al—Mg—Si alloy layer positioned on the steel plate, and wherein the Al—Mg—Si alloy layer is formed to include Mg—Si alloy grains in an alloy layer configured in an Al—Mg alloy phase.

The Al—Mg alloy phase may include $Al_3Mg_2$.
The Mg—Si alloy grains may include $Mg_2Si$.
The Mg—Si alloy grains may be amorphous.
Content of Mg—Si alloy grains in the Al—Mg—Si alloy layer may be 1 wt % or more and 70 wt % or less based on 100 wt % of the total weight of the Al—Mg—Si alloy layer.

The alloy coating steel plate may further include an Al—Si—Fe alloy layer positioned between the steel plate and the Al—Mg—Si alloy layer.

The alloy coating steel plate may further include an Mg layer or an Al—Mg alloy layer positioned on the Al—Mg—Si alloy layer.

The forming of the Mg coating layer by coating Mg on the aluminum plating steel plate may be performed via physical vapor deposition (PVD).

The aluminum plating steel plate may be a fusion aluminum plating steel plate.

According to another embodiment of the present invention, an alloy coating steel plate includes a steel plate, a plating layer including Al positioned on one surface or opposite surfaces of the steel plate, and a coating layer positioned on the plating layer, wherein the coating layer is divided into two or three layers, and wherein the coating layer includes a phase of one of Al, Si, and Mg or an alloy phase including two or more thereof.

The coating layer may be divided into three layers, and the three layers may include an Al—Si alloy layer positioned on the plating layer, an Al—Mg—Si alloy layer positioned on the Al—Si alloy layer, and an Mg layer positioned on the Al—Mg—Si alloy layer.

The coating layer may be divided into three layers, and the three layers may include an Al—Si alloy layer positioned on the plating layer, an Al—Mg—Si alloy layer positioned on the Al—Si alloy layer, and an Al—Mg layer positioned on the Al—Mg—Si alloy layer.

The coating layer may be divided into two layers, and the two layers include an Al—Si alloy layer positioned on the plating layer, and an Al—Mg—Si alloy layer positioned on the Al—Si alloy layer.

A plating layer including Al positioned on one surface or opposite surfaces of the steel plate may include an Al—Fe—Si alloy layer positioned on one surface or opposite surfaces of the steel plate, and an Al—Si alloy layer positioned on the Al—Fe—Si alloy layer.

According to another embodiment of the present invention, a method of manufacturing an alloy coating steel plate includes preparing an aluminum plating steel plate including a plating layer including Al positioned on one surface or opposite surfaces of a steel plate, forming an Mg coating layer by coating Mg on the aluminum plating steel plate, and performing heat treatment on the aluminum plating steel plate with Mg coated thereon to diffuse Mg into the plating layer.

It is preferable that the heat treatment is performed under a temperature in a range of 350 to 450° C. for a heat treatment time of 2 to 10 minutes.

The performing of the heat treatment on the aluminum plating steel plate with Mg coated thereon to diffuse Mg into the plating layer may include forming a coating layer divided into two or three layers on a plating layer including Al positioned on one surface or opposite surfaces of the steel plate, and the coating layer may include a phase of one of Al, Si, and Mg or an alloy phase including two or more thereof.

The coating layer may be divided into three layers formed on a plating layer including Al positioned on one surface or opposite surfaces of the steel plate, and the coating layer divided into three layers formed on the plating layer may include an Al—Si alloy layer positioned on the plating layer, an Al—Mg—Si alloy layer positioned on the Al—Si alloy layer, and an Mg layer positioned on the Al—Mg—Si alloy layer.

The coating layer may be divided into three layers formed on a plating layer including Al positioned on one surface or opposite surfaces of the steel plate, and the coating layer divided into three layers formed on the plating layer may include an Al—Si alloy layer positioned on the plating layer, an Al—Mg—Si alloy layer positioned on the Al—Si alloy layer, and an Al—Mg alloy layer positioned on the Al—Mg—Si alloy layer.

The coating layer may be divided into two layers formed on a plating layer including Al positioned on one surface or opposite layers of the steel plate, and the coating layer divided into two layers formed on the plating layer may include an Al—Si alloy layer positioned on the plating layer, and an Al—Mg—Si alloy layer positioned on the Al—Si alloy layer.

The coating of Mg on the aluminum plating steel plate may be performed via physical vapor deposition (PVD).

In the preparing of the aluminum plating steel plate including the plating layer including Al positioned on one surface or opposite surfaces of the steel plate, the plating layer including Al on one surface or opposite surfaces of the steel plate may include an Al—Fe—Si alloy layer positioned on one surface or opposite surfaces of the steel plate, and an Al—Si alloy layer positioned on the Al—Fe—Si alloy layer.

Advantageous Effects

An embodiment of the present invention provides an alloy coating steel plate and a method of manufacturing the same, for forming a sacrifice-type alloy film on a steel plate to obtain high anti-corrosion characteristic even in a small thickness.

MODE FOR INVENTION

Figure 1:
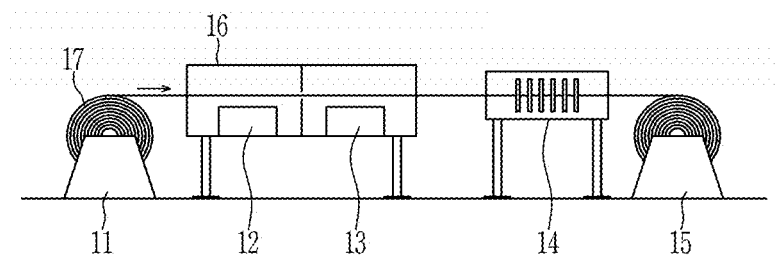
FIG. 1 is a schematic diagram of a continuous coating apparatus used to manufacture an alloy coating steel plate.

Hereinafter, the present invention will be described more fully with reference to the accompanying drawings, in which exemplary embodiments of the invention are shown. However, the exemplary embodiments are exemplary and the present invention is not limited by the embodiments. In addition, the present invention is defined by the scope of the following claims.

All terms (including technical or scientific terms) have the same meanings as generally understood by a person having ordinary skill in the art to which the present invention pertains unless mentioned otherwise. Throughout the specification, the term "comprises", "includes", or "has" described herein should be interpreted not to exclude other elements but to further include such other elements since the corresponding elements may be included unless mentioned otherwise. As used herein, the singular forms "a", "an", and "the" are intended to include the plural forms as well, unless context clearly indicates otherwise.

Sizes and thicknesses of components in the drawings are arbitrarily expressed for convenience of description and, thus, the present invention is not limited by the drawings.

Throughout the specification, when an element such as a layer, a film, a region, and a board is referred to as being "on" another element, the element can be directly on another element or intervening elements.

Throughout the specification, when an element such as layer, a film, a region, an a board is referred to as being "on" another element, the term "above" encompasses both an orientation of above and below and does not necessarily encompass the orientation of above with respect to a direction of gravity.

Throughout the specification, the term "A layer" encompasses both cases in which a corresponding layer includes only A and also includes A, unless context clearly indicates otherwise.

Throughout the specification, the term "A-B alloy layer" encompasses both cases in which a corresponding layer includes only an A-B alloy and also includes an A-B alloy, unless context clearly indicates otherwise.

Throughout the specification, the term "A-B-C alloy layer" encompasses both cases in which a corresponding layer includes only an A-B-C alloy and also includes an A-B-C alloy, unless context clearly indicates otherwise.

Recently, to overcome the problem of the fusion aluminum plating steel plate stated in the description of the related art, research has been conducted to add magnesium to the fusion aluminum plating steel plate including silicon to improve sacrifice-type characteristic as well as anti-corrosion.

For example, research has been conducted into preparation of an Al—Mg—Si plating steel plate via fusion plating to manufacture a coating steel plate with excellent anti-corrosion. However, in the case of the fusion plating method, there is a limit in controlling the content of Mg and in the case of thin-film plating to a thickness equal to or less than 20 g/m$^2$, anti-corrosion is disadvantageously and abruptly degraded. It is known that an Mg$_2$Si alloy phase improves anti-corrosion but, in this case, there is a problem in that Mg improves the characteristic only in a narrow range of about 6%. It is known that an Al—Mg—Si plating steel plate is formed in such a way that an Mg$_2$Si phase is formed on a plating layer and has excellent anti-corrosion. It is reported that anti-corrosion of an Al—Mg—Si plating steel plate is improved when an area ratio of a Mg$_2$Si phase is equal to or greater than 0.5% and equal to or less than 30% and a major axis of the Mg$_2$Si phase is equal to or less than 10 μm. However, the Al—Mg—Si plating steel plate manufactured using the fusion plating method has a limit in controlling the content of Mg during a preparation process and, thus, it is not easy to manufacture an Al—Mg—Si plating steel plate including Mg with predetermined content or more (about 15% or more).

As another example, research has been conducted into a method of forming an Al—Mg alloy layer by depositing Mg in a state in which a substrate with aluminum coated thereon is heated to 350° C. or more and 500° C. or less in a vacuum. However, this method has a problem in that Mg is deposited on a substrate heated at a high temperature in a vacuum and, thus, loss in vapor is caused and it is difficult to propose accurate materials on a change in characteristics of alloy phases with respect to an Al—Mg—Si layer.

The present invention is proposed to overcome the aforementioned problem of a fusion aluminum plating steel plate and the problem of an Al—Mg alloy steel plate and, thus, according to the present invention, Mg is coated on a fusion plating steel plate using a physical vapor deposition method and, thus, there is no limit in controlling content of Mg in an Al—Mg—Si coating layer and it is possible to manufacture various structures of a coating layer.

In detail, magnesium is deposited on a fusion aluminum plating steel plate including silicon and a multi-layered alloy film is formed via heat treatment to provide an alloy coating steel plate having both sacrifice-type characteristic and high anti-corrosion even in a low thickness.

Hereinafter, a method of manufacturing an alloy coating steel plate and the manufactured alloy coating steel plate according to embodiments of the present invention will be described.

An embodiment of the present invention may provide a method of manufacturing an alloy coating steel plate, the method including preparing an aluminum plating steel plate including a plating layer including Al and Si positioned on a steel plate, coating Mg on the aluminum plating steel plate to form a Mg coating layer, and performing heat treatment on the aluminum plating steel plate with Mg coated thereon to diffuse Mg to the plating layer.

The steel plate may be a cold rolled steel plate. However, the steel plate is not limited thereto.

The aluminum plating steel plate may be a fusion aluminum plating steel plate and, in detail, may include 8 wt % or more and 10 wt % or less of Si, 88 wt % or more and 90 wt % or less of Al, and the balance of Fe based on 100 wt % of the total weight of the plating layer.

The plating layer of the aluminum plating steel plate may include an Al—Fe—Si alloy layer and an Al—Si alloy which are formed during aluminum plating and the alloy layers may be formed on a steel plate in an order of an Al—Fe—Si alloy layer and an Al—Si alloy layer. The Al—Fe—Si alloy layer may be formed via diffusion of Fe in a steel plate into an Al—Si plating layer during manufacture of an Al plating steel plate.

The coating of Mg on the aluminum plating steel plate may be performed via physical vapor deposition (PVD). In more detail, the coating may be performed via electromagnetic levitation physical vapor deposition (EML-PVD). However, the present invention is not limited thereto and Mg may be coated using various methods as long as Mg is deposited using a physical method using an electron beam evaporation apparatus, a thermal evaporation apparatus, a sputtering source, and a cathodic arc source.

A heat treatment method in the performing of the heat treatment may be performed by an induction heating apparatus but the present invention is not limited thereto and another appropriate heating treatment element may be employed. When heat treatment is performed using another method other than an induction heating method, a heat treatment temperature may be changed according to a heat treatment method.

FIG. 1 is a schematic diagram of a continuous coating apparatus used to manufacture an alloy coating steel plate. However, the apparatus is merely an example of an apparatus used in the manufacturing method but the present invention is not limited thereto.

The apparatus may include a steel plate feeding device 11 for feeding a fusion aluminum plating steel plate 17 in the atmosphere, an inverse magnetron sputtering source 12 for preprocessing a steel plate in a vacuum, a physical vapor deposition (PVD) device 13 for coating Mg after preprocessing, an induction heating device 14 for heat-treating a steel plate discharged to the atmosphere, and a steel plate discharging device 15 for rewinding the heat-treated coating steel plate. The PVD device 13 may be an electromagnetic levitation (EML) source. The inverse magnetron sputtering source 12 and the PVD device 13 may be installed and managed in a vacuum container 16.

An exemplary method of manufacturing an alloy coating steel plate using the apparatus is now described. First, the fusion aluminum plating steel plate 17 may be prepared and alkaline cleaning may be performed to remove residual oil such as rust preventive oil stained on a surface of the steel plate.

Then, the steel plate may be fed to the vacuum container 16 while being moved through the steel plate feeding device 11. Then, electric power may be supplied to the inverse magnetron sputtering source 12 installed in the vacuum container 16 to perform steel plate surface cleaning.

After the cleaning is completed, Mg may be vacuum-coated on an Al plating layer through the EML source 13 installed in the vacuum container 16 while the steel plate is continuously moved.

After the coating is completed, the steel plate may be continuously moved and discharged to the atmosphere and, then, heat treatment may be performed at a predetermined temperature and for a predetermined time period using the induction heating device 14 in the atmosphere.

It is preferable that heat treatment of the steel plate where the coating layer is formed be performed at 350 to 450° C. for 2 to 10 minutes. If heat treatment is performed at or less than 350° C. within 2 minutes, the aluminum-magnesium layer does not form the aluminum-magnesium alloy, and if heat treatment is performed at more than 450° C. for more than 10 minutes, an iron component of the steel plate is diffused into the coating layer or magnesium is diffused into the surface of the coating layer, and thus these are not preferable. This heat treatment is preferably performed at 400° C. for 5 minutes.

After the heat treatment is completed, an alloy coating steel plate manufactured by continuously moving the steel plate may be obtained.

Hereinafter, a steel plate manufactured using the aforementioned manufacturing method is described. The characteristic of a coating steel plate according to the present invention is broadly classified into four characteristics and, throughout this specification, these are referred to as first to fourth embodiments of the present invention. Hereinafter, the first to fourth embodiments of the present invention are described in detail.

First Embodiment

Figure 2:
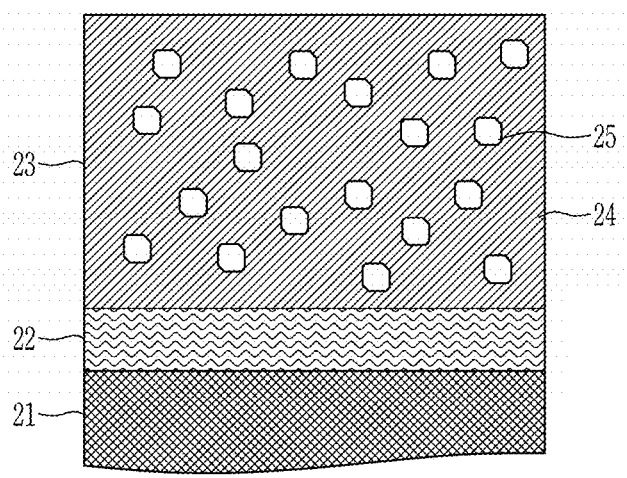
FIG. 2 is a schematic diagram of an alloy coating steel plate according to a first embodiment of the present invention.

FIG. 2 is a schematic diagram of an alloy coating steel plate according to a first embodiment of the present invention. Referring to the drawing, the alloy coating steel plate manufactured using the manufacturing method according to the first embodiment of the present invention may include a steel plate 21, and an Al—Mg—Si alloy layer 23 positioned on the steel plate 21. The Al—Mg—Si alloy layer 23 may include Mg—Si alloy grains 25 in an alloy layer including an Al—Mg alloy phase 24.

The alloy coating steel plate is manufactured by coating magnesium on a fusion aluminum plating steel plate using a physical vapor deposition method and, thus, it may be possible to manufacture an Al—Mg—Si coating layer with higher content of magnesium than in a conventional fusion plating method. When an Al—Mg—Si plating steel plate is manufactured using a fusion plating method, there is a limit in adjusting the content of magnesium during a process and, thus, it may be difficult to manufacture an Al—Mg—Si plating steel plate with magnesium of predetermined content or more (about 15% or more). Accordingly, a plating layer is configured in such a way that an Mg—Si alloy phase is present in the form of grains in an aluminum plating layer. Accordingly, it is difficult to uniformly and dispersively distribute the Mg—Si alloy phase in the form of grains in the aluminum plating layer and, thus, there is a limit in improving the anti-corrosion of the plating plate. The fusion plating process has limited Mg content and, thus, there is a problem in that an Al—Mg alloy phase is not sufficiently produced and it is difficult to control a position at which the Mg—Si alloy phase is produced.

On the other hand, with regard to the alloy coating steel plate according to the first embodiment of the present invention, it may be possible to manufacture an Al—Mg—Si coating layer in which Mg—Si alloy grains are present in a coating layer formed in an Al—Mg alloy phase unlike a plating layer manufactured using the fusion plating method, and sacrifice-type characteristic and high anti-corrosion characteristic may be obtained as supported by the following Examples.

In more detail, the Al—Mg alloy phase may include $Al_3Mg_2$ and the Mg—Si alloy grains may include $Mg_2Si$. The Al—Mg alloy phase may further include an $Al_{12}Mg_{17}$ phase.

As described above, an Al—Mg—Si alloy layer including alloy grains in a $Mg_2Si$ phase may be formed in an alloy layer including an $Al_3Mg_2$ phase and, thus, sacrifice-type characteristic may be increased to improve anti-corrosion, as supported by the following Examples. Accordingly, high corrosion may be obtained even in a small thickness range.

The Mg—Si alloy grains may be amorphous. The amorphous Mg—Si alloy grains have a wide surface area and, thus, adhesion force in the coating layer may be improved.

The content of Mg—Si alloy grains in the Al—Mg—Si alloy layer may be 1 wt % or more and 70 wt % or less based on 100 wt % of the total weight of the Al—Mg—Si alloy layer. When an Al—Mg—Si single layer is formed, content of Mg—Si alloy grains in an alloy layer may be high due to sufficient diffusion of Mg. When content of Mg—Si alloy grains is very low, anti-corrosion may be negligibly improved. When content of Mg—Si alloy grains is very high, there is a problem in that sacrifice-type characteristic is increased, a coating layer is consumed in a short time, and anti-corrosion is reduced.

The alloy coating steel plate may further include an Al—Fe—Si alloy layer 22 positioned between the steel plate 21 and the Al—Mg—Si alloy layer 23, and an Al—Fe—Si alloy layer 22 may be formed via diffusion of Fe in a steel plate into an Al—Si plating layer during manufacture of the Al plating steel plate, as described above. Alternatively, the Al—Fe—Si alloy layer 22 may be formed via diffusion of Fe in a steel plate into an Al—Si plating layer during heat treatment after Mg is coated.

An Al—Fe—Si alloy layer and an Al—Mg—Si alloy layer may be prevented from being corroded using a sequential method. Consequentially, excellent anti-corrosion characteristics may be obtained compared with a general aluminum or zinc plating layer that is prevented from being corroded using a single method such as a physical block method or a sacrifice-type method.

The alloy coating steel plate may further include an Mg layer positioned on the Al—Mg—Si alloy layer or an Al—Mg alloy layer formed via diffusion of Mg. Accordingly, anti-corrosion may be reinforced using a sequential method to achieve excellent anti-corrosion characteristic.

Second Embodiment

Figure 3:
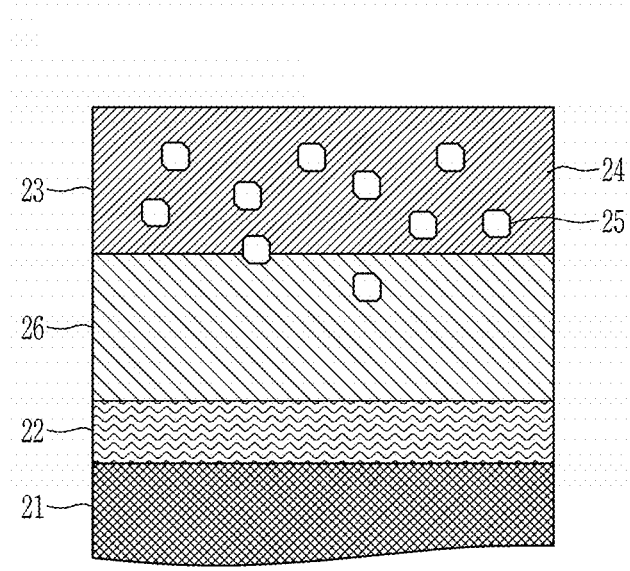
FIG. 3 is a schematic diagram of an alloy coating steel plate according to a second embodiment of the present invention.

FIG. 3 is a schematic diagram of an alloy coating steel plate according to a second embodiment of the present invention. Referring to the drawing, the alloy coating steel plate according to the second embodiment of the present invention manufactured using the manufacturing method may include the steel plate 21, an Al—Si alloy layer positioned on the steel plate, and the Al—Mg—Si alloy layer 23 positioned on the Al—Si alloy layer 26. The Al—Mg—Si alloy layer 23 may be formed in such a way that the Mg—Si alloy grains 25 are included in an alloy layer in the Al—Mg alloy phase 24.

A description of the Al—Mg—Si alloy layer is the same as in the first embodiment and, thus, is not given here.

The Al—Si alloy layer is present in an Al fusion plating steel plate or may be newly formed via diffusion of Al and Si into a steel plate in a surface direction during heat treatment in the manufacturing method.

Accordingly, an Al—Si alloy layer and an Al—Mg—Si alloy layer may be prevented from being corroded using a sequential method.

Furthermore, the alloy coating steel plate may further include the Al—Fe—Si alloy layer 22 positioned between the steel plate 21 and the Al—Mg—Si alloy layer 23, and the Al—Fe—Si alloy layer 22 may be formed via diffusion of Fe in a steel plate into an Al—Si plating layer during manufacture of the Al plating steel plate, as described above. Alternatively, the Al—Fe—Si alloy layer 22 may be formed via diffusion of Fe in a steel plate into an Al—Si plating layer during heat treatment after Mg is coated.

Accordingly, an Al—Fe—Si alloy layer, an Al—Si alloy layer, and an Al—Mg—Si alloy layer may be prevented from being corroded using a sequential method. Consequentially, excellent anti-corrosion characteristics may be obtained compared with a general aluminum or zinc plating layer that is prevented from being corroded using a single method such as a physical block method or a sacrifice-type method.

The alloy coating steel plate may further include an Mg layer positioned on the Al—Mg—Si alloy layer or an Al—Mg alloy layer formed via diffusion of Mg. Accordingly, anti-corrosion may be reinforced using a sequential method to achieve excellent anti-corrosion characteristic.

The content of Mg—Si alloy grains in the Al—Mg—Si alloy layer may be 1 wt % or more and 50 wt % or less based on 100 wt % of the total weight of the Al—Mg—Si alloy layer. When content of Mg—Si alloy grains is very low, anti-corrosion may be negligibly improved. When content of Mg—Si alloy grains is very high, there is a problem in that sacrifice-type characteristic is increased, a coating layer is consumed in a short time, and anti-corrosion is reduced.

Third Embodiment

Figure 4:
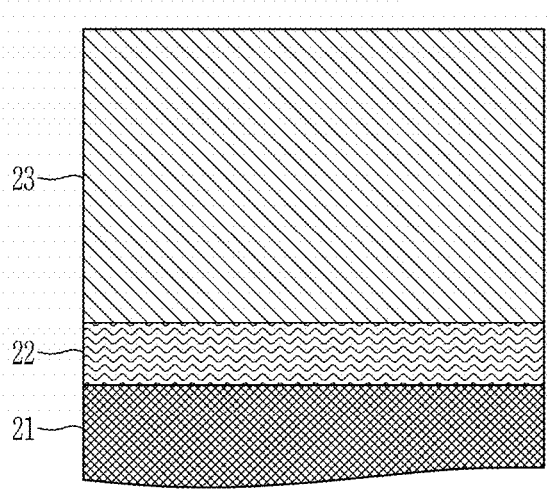
FIG. 4 is a schematic diagram of an alloy coating steel plate according to a third embodiment of the present invention.

FIG. 4 is a schematic diagram of an alloy coating steel plate according to a third embodiment of the present invention. Referring to the drawing, the alloy coating steel plate according to the third embodiment of the present invention manufactured using the manufacturing method may include the steel plate 21, and the Al—Mg—Si alloy layer 23 positioned on the steel plate. The Al—Mg—Si alloy layer 23 may be formed in such a way that gradient of Mg content is present in an alloy layer.

The alloy coating steel plate may be manufactured by coating magnesium on a fusion aluminum plating steel plate using a physical vapor deposition method and, thus, differently from the conventional art, there is a limit in controlling content of magnesium of an Al—Mg—Si alloy layer and it is possible to control magnesium distribution via diffusion heat treatment or the like and, thus, it may be possible to manufacture various structures of an Al—Mg—Si alloy layer.

Gradient of Mg content in an Al—Mg—Si layer is present and, thus, various alloy phases may be present according to Mg concentration and, thus, anti-corrosion may be expected to be improved. Examples of the various alloy phases may be $Al_{12}Mg_{17}$, $Al_3Mg_2$, $Mg_2Si$, and so on. When the alloy phase is present according to Mg concentration gradient, each alloy phase forms a layer structure and, thus, corrosion of a coating steel plate may be slowed.

In detail, the gradient of Mg content in the Al—Mg—Si alloy layer may be formed be reduced in an inward direction from a surface of the Al—Mg—Si alloy layer.

Alternatively, the gradient of Mg content in the Al—Mg—Si alloy layer may be formed be increased in an inward direction from a surface of the Al—Mg—Si alloy layer.

Alternatively, a point at which Mg content in the Al—Mg—Si alloy layer is maximized may be present, and the gradient of Mg content in the Al—Mg—Si alloy layer may be formed to be increased in an inward direction from a surface of the Al—Mg—Si alloy layer and then to be reduced from the point of the maximum Mg content.

Alternatively, a content constant part in which Mg content is constant in an inward direction from a surface of an alloy layer in the Al—Mg—Si alloy layer may be present and the Mg content may be increased from a point at which the content constant part is terminated.

Alternatively, a content constant part in which Mg content is constant in an inward direction from a surface of an alloy layer in the Al—Mg—Si alloy layer may be present and the Mg content may be reduced from a point at which the content constant part is terminated.

As described above, since there is no limit in controlling content of magnesium in an Al—Mg—Si alloy layer in a manufacturing method of an alloy coating steel plate according to the present invention and it is possible to control distribution of magnesium via diffusion heat treatment or the like, it may be possible to manufacture various structures of an Al—Mg—Si alloy layer and, accordingly, differently from a fusion plating steel plate with a uniform Mg concentration, it may be possible to manufacture an alloy layer with a layer structure to appropriately combine sacrifice-type characteristic and block corrosion resistance to maximize anti-corrosion.

As supported by the following Examples, high anti-corrosion characteristic may be obtained.

Although not shown in FIG. 4, the alloy coating steel plate may further include an Al—Si alloy layer positioned between the steel plate and the Al—Mg—Si alloy layer.

The Al—Si alloy layer may be present in an Al fusion plating steel plate or may be newly formed via diffusion of Al and Si into a steel plate in a surface direction during heat treatment in the manufacturing method.

Accordingly, an Al—Si alloy layer and an Al—Mg—Si alloy layer may be prevented from being corroded using a sequential method.

Furthermore, the alloy coating steel plate may further include the Al—Fe—Si alloy layer 22 positioned between the steel plate 21 and the Al—Mg—Si alloy layer 23, and the Al—Fe—Si alloy layer 22 may be formed via diffusion of Fe in a steel plate into an Al—Si plating layer during manufacture of the Al plating steel plate, as described above. Alternatively, the Al—Fe—Si alloy layer 22 may be formed via diffusion of Fe in a steel plate into an Al—Si plating layer during heat treatment after Mg is coated.

Accordingly, an Al—Fe—Si alloy layer, an Al—Si alloy layer, and an Al—Mg—Si alloy layer may be prevented from being corroded using a sequential method. Consequentially, excellent anti-corrosion characteristics may be obtained compared with a general aluminum or zinc plating layer that is prevented from being corroded using a single method such as a physical block method or sacrifice-type characteristic.

The alloy coating steel plate may further include an Mg layer positioned on the Al—Mg—Si alloy layer or an Al—Mg alloy layer formed via diffusion of Mg. Accordingly, anti-corrosion may be reinforced using a sequential method to achieve excellent anti-corrosion characteristic.

The Al—Mg—Si alloy layer of the alloy coating steel plate may be formed in such a way that Mg—Si alloy grains are included in an alloy layer in an Al—Mg alloy phase.

The shape may also improve anti-corrosion, which has been described above.

Fourth Embodiment

Figure 5:
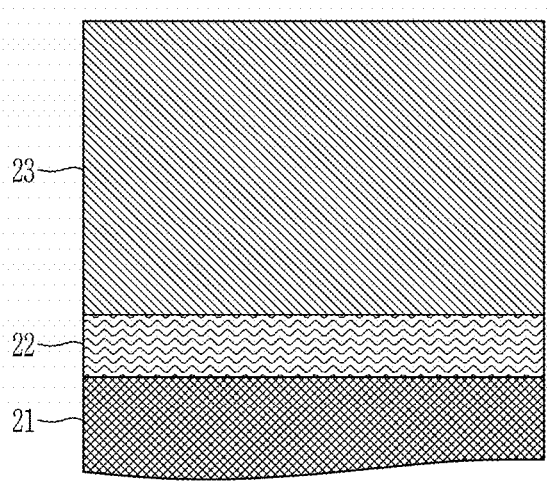
FIG. 5 is a schematic diagram of an alloy coating steel plate according to a fourth embodiment of the present invention.

FIG. 5 is a schematic diagram of an alloy coating steel plate according to a fourth embodiment of the present invention. Referring to the drawing, the alloy coating steel plate according to the fourth embodiment of the present invention manufactured using the manufacturing method may include the steel plate 21, and the Al—Mg—Si alloy layer 23 positioned on the steel plate. Content of Mg in the Al—Mg—Si alloy layer 23 may be 15 wt % or more based on 100 wt % of the total weight of the Al—Mg—Si alloy layer. In more detail, the Mg content may be 15 wt % or more and 90 wt % or less.

The alloy coating steel plate is manufactured by coating magnesium on the fusion aluminum plating steel plate using a physical vapor deposition method and, thus, it may be possible to manufacture an Al—Mg—Si coating layer with higher content of magnesium than in a conventional fusion plating method. When an Al—Mg—Si plating steel plate is manufactured using a fusion plating method, there is a limit in adjusting content of magnesium during a process and, thus, it may be difficult to manufacture the Al—Mg—Si plating steel plate including magnesium (about 15% or more) of predetermined content or more.

On the other hand, with regard to the alloy coating steel plate according to the fourth embodiment of the present invention, there is no limit in controlling Mg content and it may be possible to manufacture the Al—Mg—Si plating steel plate with Mg of high content, differently from the fusion plating method. Accordingly, sacrifice-type characteristic and high anti-corrosion characteristic may be obtained as supported by the following Examples.

Although not shown in FIG. 5, the alloy coating steel plate may further include an Al—Si alloy layer positioned between the steel plate and the Al—Mg—Si alloy layer.

The Al—Si alloy layer may be present in an Al fusion plating steel plate or may be newly formed via diffusion of Al and Si into a steel plate in a surface direction during heat treatment in the manufacturing method.

Accordingly, an Al—Si alloy layer and an Al—Mg—Si alloy layer may be prevented from being corroded using a sequential method.

Furthermore, the alloy coating steel plate may further include the Al—Si—Fe alloy layer 22 positioned between the steel plate 21 and the Al—Mg—Si alloy layer 23 and the Al—Si—Fe alloy layer 22 may be formed via diffusion of Fe in a steel plate into an Al—Si plating layer during manufacture of the Al plating steel plate, as described above. Alternatively, the Al—Fe—Si alloy layer 22 may be formed via diffusion of Fe in a steel plate into an Al—Si plating layer during heat treatment after Mg is coated.

Accordingly, an Al—Fe—Si alloy layer, an Al—Si alloy layer, and an Al—Mg—Si alloy layer may be prevented from being corroded using a sequential method. Consequentially, excellent anti-corrosion characteristics may be obtained compared with a general aluminum or zinc plating layer that is prevented from being corroded using a single method such as a physical block method or sacrifice-type characteristic.

The alloy coating steel plate may further include an Mg layer positioned on the Al—Mg—Si alloy layer or an Al—Mg alloy layer formed via diffusion of Mg. Accordingly, anti-corrosion may be reinforced using a sequential method to achieve excellent anti-corrosion characteristic.

The Al—Mg—Si alloy layer of the alloy coating steel plate may be formed in such a way that Mg—Si alloy grains are included in an alloy layer in an Al—Mg alloy phase.

The shape may also improve anti-corrosion, which has been described above.

An embodiment of the present invention may provide a method of manufacturing an alloy coating steel plate, the method including preparing an aluminum plating steel plate including a plating layer including Al positioned on one surface or opposite surfaces of a steel plate, forming an Mg coating layer by coating Mg on the aluminum plating steel plate, and performing heat treatment on the aluminum plating steel plate with Mg coated thereon to diffuse Mg into the plating layer.

The steel plate may be a cold rolled steel plate. However, the steel plate is not limited thereto.

The aluminum plating steel plate may be a fusion aluminum plating steel plate and, in detail, may include 8 wt % or more and 10 wt % or less of Si, 88 wt % or more and 90 wt % or less of Al, and the balance of Fe based on 100 wt % of the total weight of the plating layer.

The plating layer of the aluminum plating steel plate may include an Al—Fe—Si alloy layer and an Al—Si alloy layer which are formed during aluminum plating and the alloy layers may be formed on a steel plate in an order of an Al—Fe—Si alloy layer and an Al—Si alloy layer. The Al—Fe—Si alloy layer may be formed via diffusion of Fe in a steel plate into an Al—Si plating layer during manufacture of an Al plating steel plate.

The coating of Mg on the aluminum plating steel plate may be performed via physical vapor deposition (PVD). In more detail, the coating may be performed via electromagnetic levitation physical vapor deposition (EML-PVD). However, the present invention is not limited thereto and Mg may be coated using various methods as long as Mg is deposited using a physical method using an electron beam evaporation apparatus, a thermal evaporation apparatus, and a sputtering source.

In more detail, in the manufacturing method of the alloy plating steel plate, via the performing of heat treatment on the aluminum plating steel plate with Mg coated thereon to diffuse Mg into the plating layer, a coating layer divided into two or three layers may be formed on a plating layer including Al positioned on one surface or opposite surfaces of the steel plate and, in this case, the coating layer may include a phase of one of Al, Si, and Mg or an alloy phase including two or more thereof.

A heat treatment method in the performing of the heat treatment may be performed by an induction heating apparatus but the present invention is not limited thereto and another appropriate heating treatment element may be employed. When heat treatment is performed using another method other than an induction heating method, a heat treatment temperature may be changed according to a heat treatment method.

In detail, the coating layer may be a coating layer divided into three layers formed on a plating layer including Al positioned on one surface or opposite surfaces of the steel plate and the coating layer divided into three layers formed on the plating layer may include an Al—Si alloy layer positioned on the plating layer, an Al—Mg—Si alloy layer positioned on the Al—Si alloy layer, and an Mg layer positioned on the Al—Mg—Si alloy layer.

Alternatively, the coating layer may be a coating layer divided into three layers formed on a plating layer including Al positioned on one surface or opposite surfaces of the steel plate and the coating layer divided into three layers formed on the plating layer may include an Al—Si alloy layer positioned on the plating layer, an Al—Mg—Si alloy layer positioned on the Al—Si alloy layer, and an Al—Mg alloy layer positioned on the Al—Mg—Si alloy layer.

That is, a layer structure in which Mg layer (or Al—Mg alloy layer)/Al—Mg—Si alloy layer/Al—Si alloy layer/Al—Fe—Si alloy layer are sequentially formed from a surface of a steel plate may be formed. Accordingly, metal or alloy present in each layer may prevent a material causing corrosion from reaching a steel plate (Al—Si). In addition, corrosion may be prevented using a sequential method as anti-corrosion based on sacrifice-type characteristic (Mg, Al—Mg—Si, Al—Mg). Consequentially, excellent anti-corrosion characteristics may be obtained compared with a general aluminum or zinc plating layer that is prevented from being corroded using a single method such as a physical block method or a sacrifice-type method.

The coating layer may be a coating layer divided into two layers formed on a plating layer including Al positioned on one surface or opposite surfaces of the steel plate and the coating layer divided into two layers formed on the plating layer may include an Al—Si alloy layer positioned on the plating layer, and an Al—Mg—Si alloy layer positioned on the Al—Si alloy layer.

That is, a layer structure in which Al—Mg—Si alloy layer/Al—Si alloy layer/Al—Fe—Si alloy layer are sequentially formed from a surface of a steel plate may be formed. Accordingly, metal or alloy present in each layer may prevent a material causing corrosion from reaching a steel plate (Al—Si). In addition, corrosion may be prevented using a sequential method as anti-corrosion based on sacrifice-type characteristic (Al—Mg—Si). Consequentially, excellent anti-corrosion characteristics may be obtained compared with a general aluminum or zinc plating layer that is prevented from being corroded using a single method such as a physical block method or a sacrifice-type method.

Figure 13:
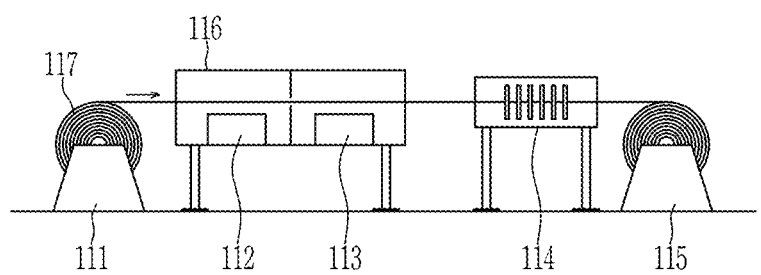
FIG. 13 is a schematic diagram illustrating an apparatus used in an exemplary manufacturing method of an alloy coating steel plate according to an embodiment of the present invention.

FIG. 13 is a schematic diagram illustrating an apparatus used in an exemplary manufacturing method of an alloy coating steel plate according to an embodiment of the present invention. With reference to FIG. 13, the exemplary manufacturing method of the alloy coating steel plate according to an embodiment of the present invention is described below.

The apparatus of FIG. 13 may be a continuous coating device and may include the steel plate feeding device 111 for feeding a fusion aluminum plating steel plate 117 in the atmosphere, an inverse magnetron sputtering source 1112 for preprocessing a steel plate in a vacuum, a PVD device 1113 for coating Mg after preprocessing, an heating device 114 for heat-treating a steel plate discharged to the atmosphere, and a steel plate discharging device 115 for rewinding the heat-treated coating steel plate. The PVD device 113 may be an electromagnetic levitation (EML) source. The inverse magnetron sputtering source 112 and the PVD device 113 may be installed and managed in a vacuum container 116.

An exemplary method of manufacturing an alloy coating steel plate using the apparatus is now described. First, the fusion aluminum plating steel plate 117 may be prepared and alkaline cleaning may be performed to remove residual oil such as rust preventive oil stained on a surface of the steel plate.

Then, the steel plate may be fed to the vacuum container 116 while being moved through the steel plate feeding device 111. Then, electric power may be supplied to the inverse magnetron sputtering source 112 installed in the vacuum container 116 to perform steel plate surface cleaning.

After the cleaning is completed, Mg may be vacuum-coated on an Al plating layer through the EML source 113 installed in the vacuum container 116 while the steel plating is continuously moved.

After the coating is completed, the steel plate may be continuously moved and discharged to the atmosphere and, then, heat treatment may be performed at a predetermined temperature and for a predetermined time period using the induction heating device 114 in the atmosphere.

After the heat treatment is completed, an alloy coating steel plate manufactured by continuously moving the steel plate may be obtained.

Hereinafter, an alloy coating steel plate manufactured using the aforementioned manufacturing method of an alloy coating steel plate is described.

Another embodiment of the present invention may provide an alloy coating steel plate including a steel plate, a plating layer including Al positioned on one surface or opposite surfaces of the steel plate, and a coating layer positioned on the plating layer and, in this case, the coating layer may be divided into two or three layers and may include a phase of one of Al, Si, and Mg or an alloy phase including two or more thereof.

The steel plate may be a cold rolled steel plate. However, the steel plate is not limited thereto.

In detail, the coating layer may be divided into three layers and the three layers may include an Al—Si alloy layer positioned on the plating layer, an Al—Mg—Si alloy layer positioned on the Al—Si alloy layer, and an Mg layer positioned on the Al—Mg—Si alloy layer.

Alternatively, the coating layer may be divided into three layers and the three layers may include an Al—Si alloy layer positioned on the plating layer, an Al—Mg—Si alloy layer positioned on the Al—Si alloy layer, and an Al—Mg layer positioned on the Al—Mg—Si alloy layer.

In more detail, when heat treatment is performed at a relatively low temperature, a portion of Mg of the Mg coating layer of a surface of the steel plate may be diffused into the aluminum plating layer and a non-diffused portion of Mg may remain on a surface and, thus, the Mg layer may remain. Alternatively, the Mg layer of the surface may be removed and an Al—Mg alloy layer may be formed on surface.

In addition, the Al—Mg—Si alloy layer positioned on the plating layer may include an $Al_{12}Mg_{17}$ phase produced when Mg content is high compared with Al content.

As described above, the Mg layer of the surface or the Al—Mg alloy layer including the $Al_{12}Mg_{17}$ phase may be included to provide both anti-corrosion and sacrifice-type characteristic via a block method of the plating layer, thereby improving anti-corrosion. Accordingly, high anti-corrosion may be obtained even in a low thickness range.

The coating layer may be divided into two layers and the two layers may include an Al—Si alloy layer positioned on the plating layer and an Al—Mg—Si alloy layer positioned on the Al—Si alloy layer.

In detail, heat treatment is performed at a relatively high temperature and, accordingly, the amount of Mg of the surface, diffused into the coating layer, may be increased to remove the surface Mg coating layer and, since Mg is deeply disused into the Al—Si alloy layer, the Mg content is relatively lower than Al content. Accordingly, an $Al_{12}Mg_{17}$ phase produced when Mg content is high may be removed and an $Al_3Mg_2$ phase may be formed. In addition, Si and Mg may react with high Mg content to form an $Mg_2Si$ phase.

As described above, the Al—Mg—Si alloy layer including an $Mg_2Si$ phase and an $Al_3Mg_2$ phase may be formed to increase sacrifice-type characteristic and to improve anti-corrosion of the plating steel plate. Accordingly, high corrosion may be obtained even in a small thickness range.

The plating layer including Al may include an Al—Fe—Si alloy layer and an Al—Si alloy layer which are formed on a steel plate during aluminum plating and the alloy layers may be formed on the steel plate in an order of the Al—Fe—Si alloy layer and the Al—Si alloy layer. The Al—Fe—Si alloy layer may be formed via diffusion of Fe in a steel plate into an Al—Si plating layer during manufacture of the Al plating steel plate.

Figure 14:
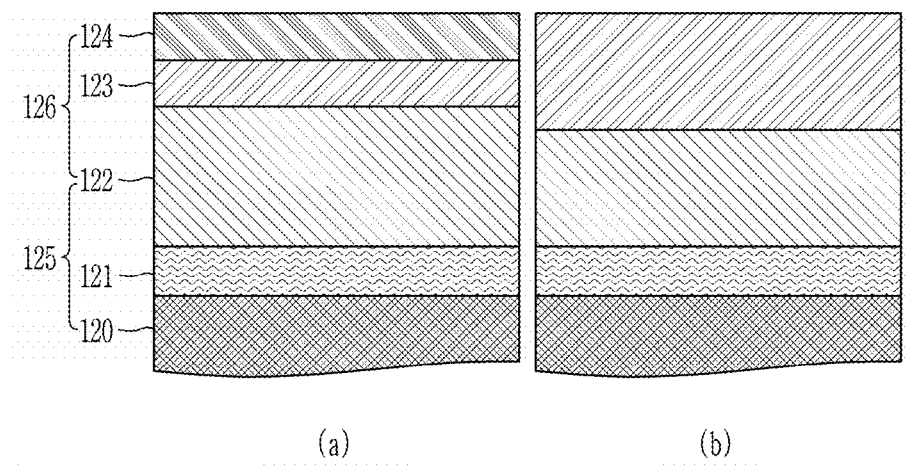
FIG. 14 is a schematic diagram of a configuration of a coating layer of an alloy coating steel plate according to an exemplary embodiment of the present invention.

FIG. 14 is a schematic diagram of an alloy coating steel plate formed by adjusting the aforementioned heat treatment temperature range.

With reference to FIG. 14, a detailed structure of the alloy coating steel plate according to an embodiment of the present invention is expanded and described.

In FIG. 14, 120 refers to a cold rolled steel plate, 121 refers to an Al—Fe—Si alloy layer, 122 refers to an Al—Si alloy layer, and 125 refers to a general structure of a fusion aluminum plating steel plate. In addition, 126 refers to a coating layer formed according to an embodiment of the present invention.

When Mg is coated on the fusion aluminum plating steel plate and, then, is heat-treated at 300° C., the Mg coating layer of the surface reacts with the Al—Si alloy layer 122 to form the Al—Mg—Si alloy layer 123 as shown in FIG. 14A. At a heat treatment temperature of 300° C., Mg remains on a surface without change and the Al—Si alloy layer is present to provide three-layer structure.

FIG. 14B is a schematic diagram of a structure of a coating layer formed by coating Mg on the fusion aluminum plating steel plate and, then, performing heat treatment at 375° C. When Mg coated on the fusion aluminum plating steel plate is heat-treated at 375° C., entire content of Mg may be diffused to the Al—Si alloy layer 122. Entire content of Mg of the Mg coating layer present on the surface may be diffused to an Al—Si alloy layer to remove the Mg layer and only the Al—Mg—Si alloy layer 123 and the Al—Si layer 122 may remain. However, Mg may not be diffused up to an interface with the Al—Si—Fe alloy layer and the Al—Si alloy layer may remain.

Hereinafter, exemplary Examples according to the present invention and Comparative Examples are described. However, the following Examples are merely an exemplary embodiment of the present invention and the present invention is not limited to the following Examples.

Example: Structure of Alloy Coating Steel Plate

Example 1

An Al plating layer including 9 wt % of Si, 88 wt % of Al, and the balance of Fe was formed with a one-sided plating amount of 15 g/m² on a cold rolled steel plate to prepare a fusion aluminum plating steel plate. A thickness of the Al plating layer was about 6 um.

Alkaline cleaning was performed to remove residual oil such as rust preventive oil stained on a surface of the steel plate.

Then, as the steel plate was fed to a vacuum container through a steel plate feeding device, steel plate surface cleaning was performed using an inverse magnetron sputtering source installed in a vacuum container.

After the cleaning is completed, Mg was vacuum-coated to a thickness of 1.0 um on an Al plating layer through the EML source installed in the vacuum container while the steel plate was continuously moved.

After the coating was completed, the steel plate was continuously moved and discharged to the atmosphere and, then, heat treatment was performed using the induction heating device in the atmosphere. After the heat treatment was completed, an alloy coating steel plate manufactured by continuously moving the steel plate was obtained.

Example 2

An alloy coating steel plate was manufactured using the same method as in Example 1 above.

Example 3

An alloy coating steel plate was manufactured using the same method as in Example 1 above.

Example 4

An alloy coating steel plate was manufactured using the same method as in Example 1 above except that Mg was vacuum-coated to a thickness of 1.5 um on the Al plating layer.

Comparative Example 1

An Al plating layer including 9 wt % of Si, 88 wt % of Al, and the balance of Fe was formed with a one-sided plating amount of 15 g/m² on a steel pate to prepare a fusion aluminum plating steel plate.

Comparative Example 2

An electrical zinc plating steel plate with a one-sided plating amount of 40 g/m² was prepared.

Comparative Example 3

A fusion zinc plating steel plate with a one-sided plating amount of 137.5 g/m² was prepared.

Information on specimens manufactured in Examples 1 to 4 above and Comparative Examples 1 to 3 above is shown in Table 1 below.

TABLE 1

| Division | Plating material | Plating amount (one side, g/m²) | Coating material | Coating thickness (um) |
|---|---|---|---|---|
| Example 1 | Al—Si | 15 | Mg | 1.0 |
| Example 2 | Al—Si | 15 | Mg | 1.0 |
| Example 3 | Al—Si | 15 | Mg | 1.0 |
| Example 4 | Al—Si | 15 | Mg | 1.5 |
| Comparative Example 1 | Al—Si | 15 | — | — |
| Comparative Example 2 | Zn | 40 | — | — |
| Comparative Example 3 | Zn | 137.5 | — | — |

EXPERIMENTAL EXAMPLE

Experimental Example 1: Scanning Electron Microscope (SEM) Image Observation

Figure 6:
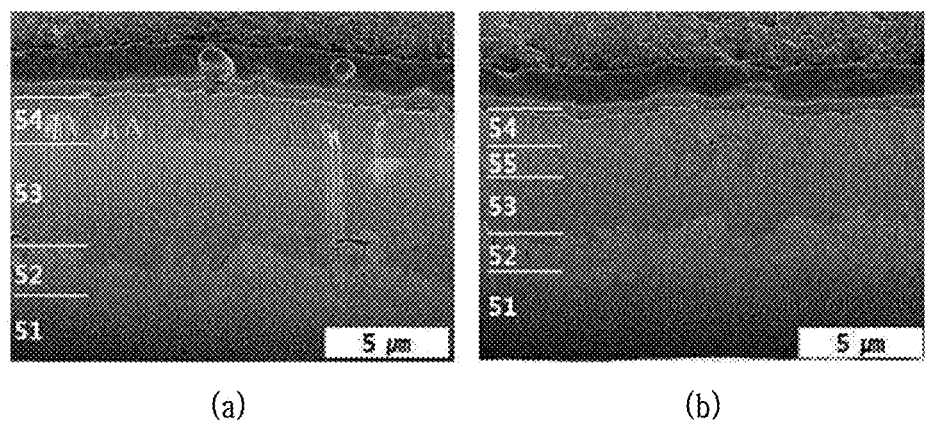
FIG. 6 is a scanning electron microscope (SEM) image before and after heat treatment of a fusion aluminum plating steel plate with Mg coated thereon of Example 2.

FIG. 6 is an SEM image before and after heat treatment of a fusion aluminum plating steel plate with Mg coated thereon of Example 2 above.

FIG. 6A is an SEM image of a steel plate on which heat treatment is not performed, formed by coating Mg on a fusion aluminum plating steel plate and, in this case, the steel plate may be divided into a cold rolled steel plate 51, an Al—Fe—Si alloy layer 52, an Al—Si alloy layer 53, and an Mg coating layer 54.

FIG. 6B is an SEM image of Example 2 in which heat treatment is performed and, as seen from FIG. 6B, Mg was diffused to an Al—Si alloy layer to form an Al—Mg—Si alloy layer 55.

Figure 7:
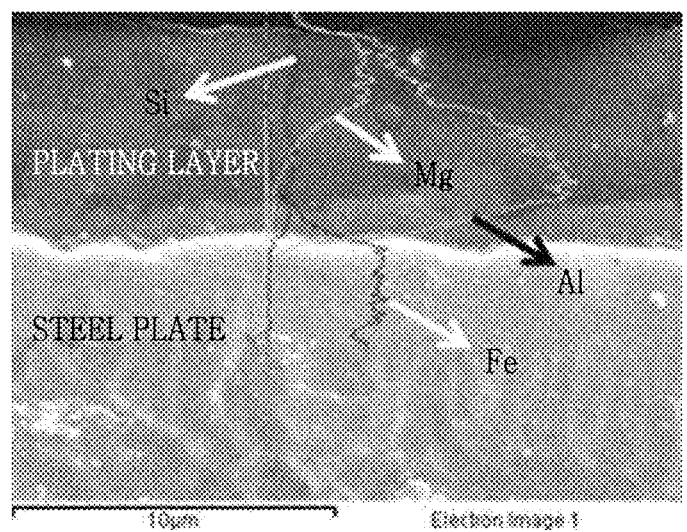
FIG. 7 is an SEM image of an alloy coating steel plate manufactured in Example 4.

FIG. 7 is an SEM image of an alloy coating steel plate manufactured in Example 4 above. Contents of components in the coating layer were indicated by different lines. As seen from FIG. 7, high content of Mg was maintained to a predetermined depth from a surface of an Al—Mg—Si alloy layer and, then, content of Mg was reduced in an interface direction with a steel plate. In addition, it was also seen that an Al—Si plating layer is present.

Figure 8:
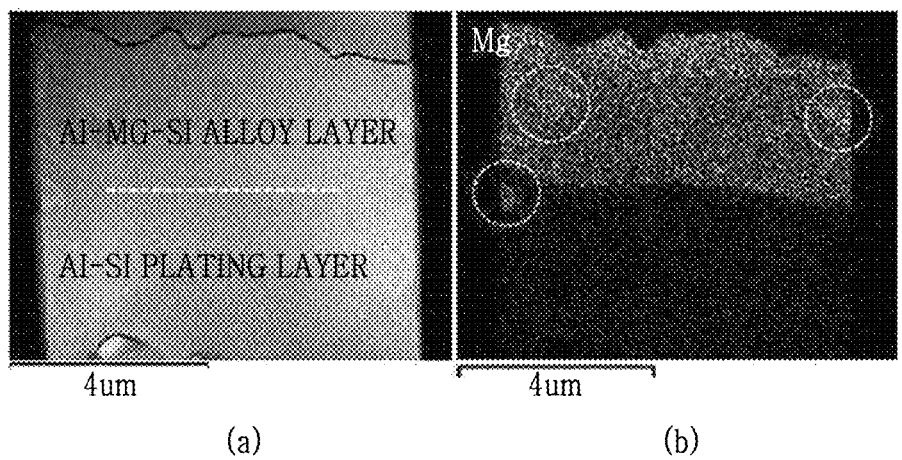
FIG. 8 is a transmission electron microscope (TEM) image of an alloy coating steel plate manufactured in Example 2.

Experimental Example 2: Transmission Electron Microscope (TEM) Image Observation FIG. 8 is a TEM image of an alloy coating steel plate manufactured in Example 2. As seen from FIG. 8, an Al—Mg—Si alloy layer is formed in such a way that $Mg_2Si$ alloy grains are present in an alloy layer including an $Al_3Mg_2$ phase.

Experimental Example 3: XRD Analysis

XRD analysis was performed on the alloy coating steel plate manufactured in Examples 1 and 2 above using an X-Ray diffraction apparatus (apparatus name: D/MAX-2500V-PC available from Rigaku).

Figure 9:
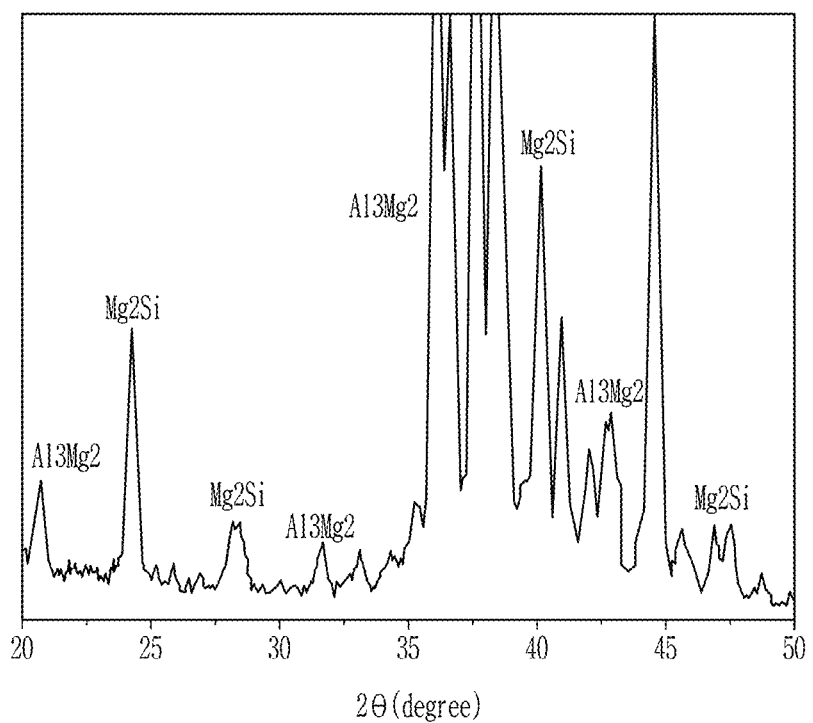
FIG. 9 shows an X-Ray diffraction analysis result of an Al—Mg—Si alloy layer of an alloy coating steel plate of Example 1.

FIG. 9 shows an X-Ray diffraction analysis result of an Al—Mg—Si alloy layer of the alloy coating steel plate of Example 1. As seen from FIG. 9, the Al—Mg—Si alloy layer is configured in an $Al_3Mg_2$ alloy phase and an $Mg_2Si$ alloy phase.

Figure 10:
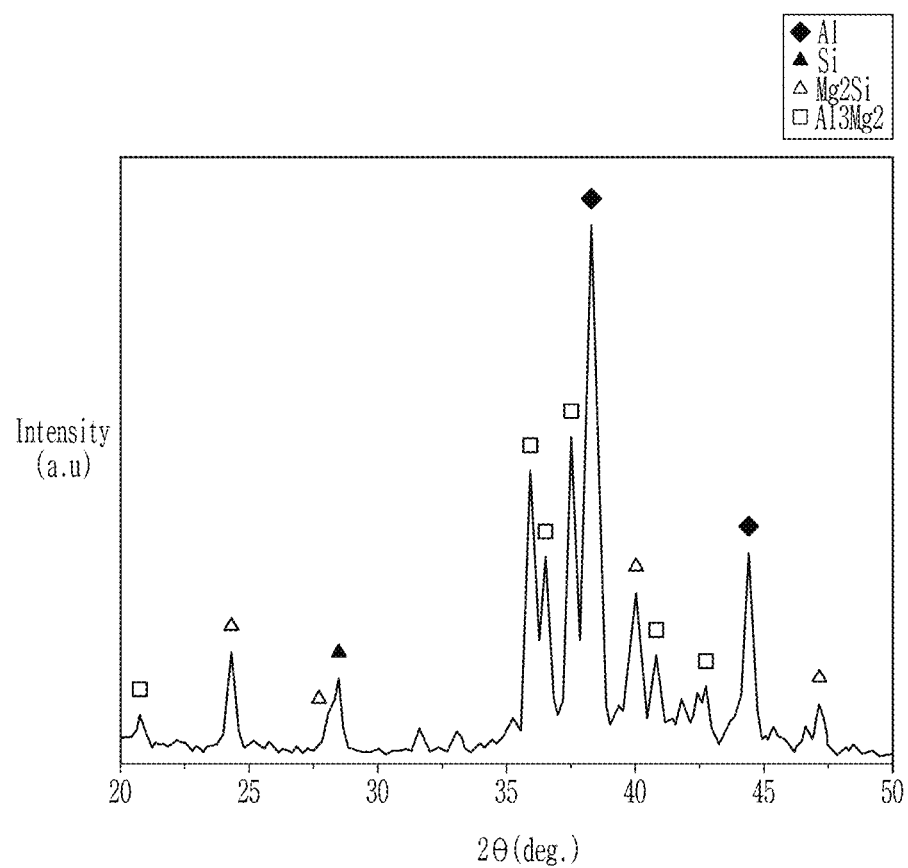
FIG. 10 shows an X-Ray diffraction analysis result of an Al—Mg—Si alloy layer of the alloy coating steel plate of Example 2.

FIG. 10 shows an X-Ray diffraction analysis result of an Al—Mg—Si alloy layer of the alloy coating steel plate of Example 2. As seen from FIG. 10, the Al—Mg—Si alloy layer is configured in an $Al_3Mg_2$ alloy phase and an $Mg_2Si$ alloy phase. With regard to a pure Al phase and Si phase, pure metal present in the Al—Si alloy layer is determined to be detected.

Experimental Example 4: Glow Discharge Light Spectroscopy Analysis

With regard to the alloy coating steel plate manufactured in Example 3 above, components of a coating layer formed on a steel plate were analyzed using a glow discharge light spectroscopy (apparatus name: GDS 850A available from NECO).

Figure 11:
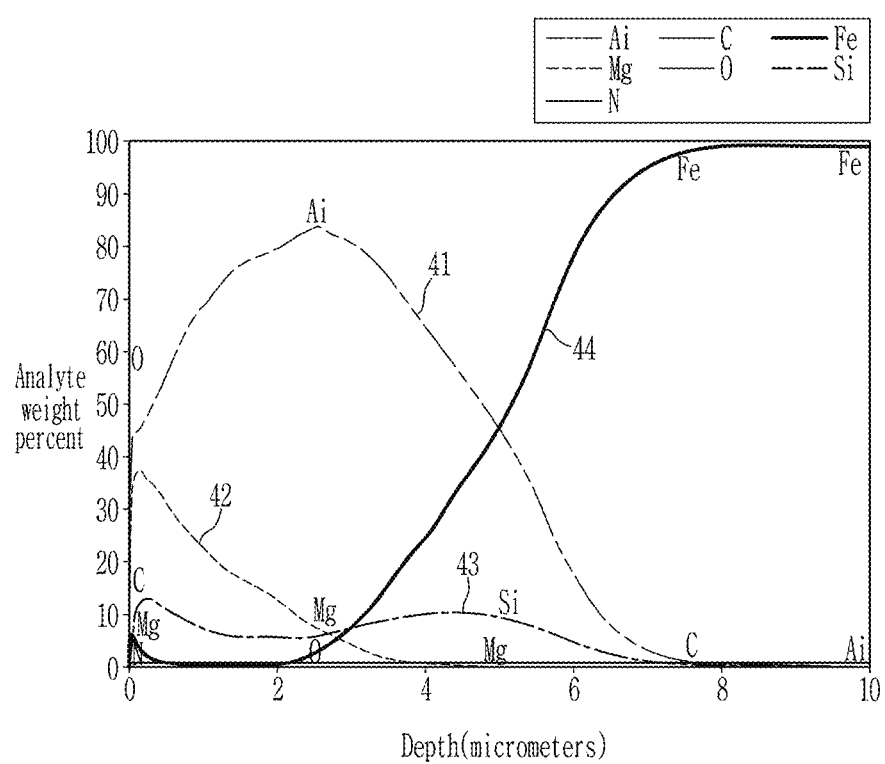
FIG. 11 shows glow discharge light spectroscopy analysis result of an alloy coating steel plate of Example 3.

The result is shown in FIG. 11. As seen from FIG. 11, Mg is diffused to a fusion aluminum plating layer via heat treatment. In addition, it is seen that content of Mg in a surface of the Al—Mg—Si alloy layer is high and is linearly reduced in an interface direction with a steel plate. It is seen that content of Mg in the Al—Mg—Si alloy layer is 15 wt % or more.

Figure 12:
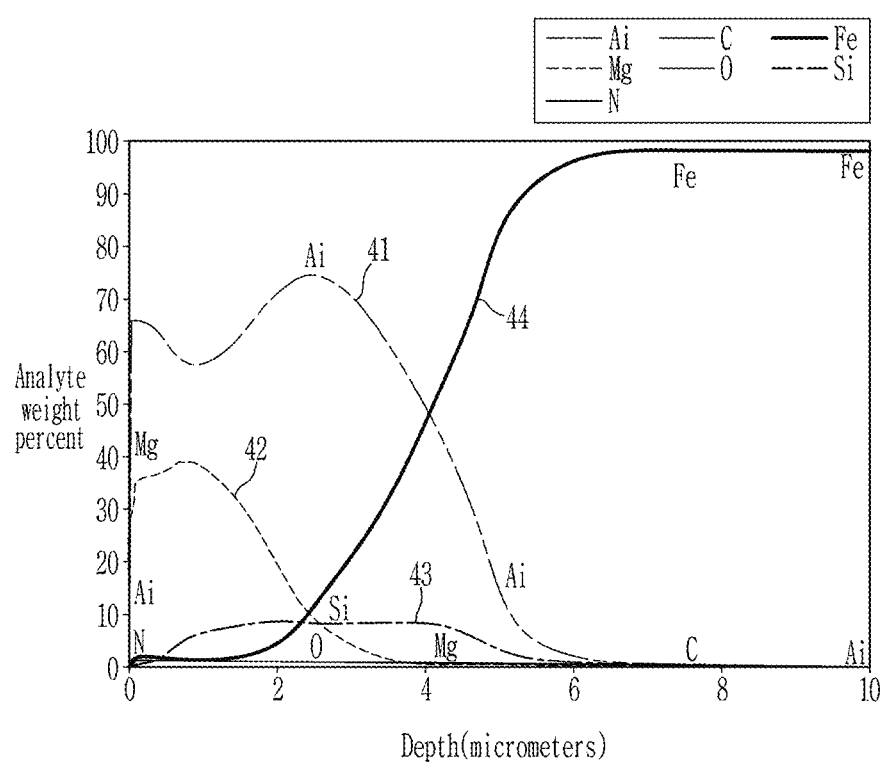
FIG. 12 shows a glow discharge light spectroscopy analysis result of the alloy coating steel plate manufactured in Example 4.

FIG. 12 shows a glow discharge light spectroscopy analysis result of the alloy coating steel plate manufactured in Example 4 above.

As seen from FIG. 12, Mg is diffused to a fusion aluminum plating layer via heat treatment. In addition, it is seen that content of Mg is increased to a predetermined depth from a surface of the Al—Mg—Si alloy layer and, then, is reduced in an interface direction with a steel plate. It is seen that content of Mg in the Al—Mg—Si alloy layer is layer is 15 wt % or more.

Experimental Example 5: Anti-Corrosion Estimation

With regard to specimens of the steel plates of Examples 1 to 4 above and Comparative Examples 1 to 3 above, anti-corrosion of a surface was estimated based on a time point of initially generating red rust using a salt spray test (ASTM B-117) method. The result is shown in Table 2 below.

TABLE 2

| Division | Plating material | Plating amount (one side, g/m$^2$) | Coating material | Coating thickness (μm) | Red rust generating time (hour) |
|---|---|---|---|---|---|
| Example 1 | Al—Si | 15 | Mg | 1.0 | 1296 |
| Example 2 | Al—Si | 15 | Mg | 1.0 | 1536 |
| Example 3 | Al—Si | 15 | Mg | 1.0 | 2200 |
| Example 4 | Al—Si | 15 | Mg | 1.5 | 2000 |
| Comparative Example 1 | Al—Si | 15 | — | — | 48 |
| Comparative Example 2 | Zn | 40 | — | — | 24 |
| Comparative Example 3 | Zn | 137.5 | — | — | 96 |

As seen from Table 2 above, red rust was generated within a time period less than 100 hours in Comparative Examples 1 to 3. On the other hand, it is seen that Examples 1 to 4 above have anti-corrosion from minimum of 10 times or more to maximum of about 90 times or more compared with Comparative Examples.

Accordingly, an alloy coating steel plate including an Al—Mg—Si alloy layer according to the present invention has much improved anti-corrosion compared with a conventional alloy coating steel plate and, thus, is expected to be usefully applied to surface processing a product that requires high anti-corrosion.

Example 5

An Al plating layer including 9 wt % of Si, 88 wt % of Al, and the balance of Fe was formed with a one-sided plating amount of 15 g/m$^2$ on a cold rolled steel plate to prepare a fusion aluminum plating steel plate. A thickness of the Al plating layer was about 6 um.

Alkaline cleaning was performed to remove residual oil such as rust preventive oil stained on a surface of the steel plate.

Then, as the steel plate was fed to a vacuum container through a steel plate feeding device, steel plate surface cleaning was performed using an inverse magnetron sputtering source installed in a vacuum container.

After the cleaning is completed, Mg was vacuum-coated to a thickness of 0.5 um on an Al plating layer through the EML source installed in the vacuum container while the steel plate was continuously moved.

After the coating was completed, the steel plate was continuously moved and discharged to the atmosphere and, then, heat treatment was performed using the induction heating device at 375° C. for 10 minutes in the atmosphere. After the heat treatment was completed, an alloy coating steel plate manufactured by continuously moving the steel plate was obtained.

Example 6

An alloy coating steel plate was manufactured using the same method as in Example 5 above except that Mg was vacuum-coated to a thickness of 1 um and heat-treated at 375° C. for 10 minutes.

Example 7

An alloy coating steel plate was manufactured using the same method as in Example 5 above except that Mg was vacuum-coated to a thickness of 1.5 um and heat-treated at 375° C. for 10 minutes.

Example 8

An alloy coating steel plate was manufactured using the same method as in Example 5 above except that Mg was vacuum-coated to a thickness of 0.5 um and heat-treated at 400° C. for 2 minutes.

Example 9

An alloy coating steel plate was manufactured using the same method as in Example 5 above except that Mg was vacuum-coated to a thickness of 0.5 um and heat-treated at 400° C. for 5 minutes.

Example 10

An alloy coating steel plate was manufactured using the same method as in Example 5 above except that Mg was vacuum-coated to a thickness of 0.5 um and heat-treated at 400° C. for 10 minutes.

Example 11

An alloy coating steel plate was manufactured using the same method as in Example 5 above except that Mg was vacuum-coated to a thickness of 1.0 um and heat-treated at 400° C. for 2 minutes.

Example 12

An alloy coating steel plate was manufactured using the same method as in Example 5 above except that Mg was vacuum-coated to a thickness of 1.0 urn and heat-treated at 400° C. for 5 minutes.

Example 13

An alloy coating steel plate was manufactured using the same method as in Example 5 above except that Mg was vacuum-coated to a thickness of 1.0 urn and heat-treated at 400° C. for 10 minutes.

Example 14

An alloy coating steel plate was manufactured using the same method as in Example 5 above except that Mg was vacuum-coated to a thickness of 1.5 urn and heat-treated at 400° C. for 2 minutes.

Example 15

An alloy coating steel plate was manufactured using the same method as in Example 5 above except that Mg was vacuum-coated to a thickness of 1.5 urn and heat-treated at 400° C. for 5 minutes.

Example 16

An alloy coating steel plate was manufactured using the same method as in Example 5 above except that Mg was vacuum-coated to a thickness of 1.5 urn and heat-treated at 400° C. for 10 minutes.

Comparative Example 4

An alloy coating steel plate was manufactured using the same method as in Example 5 above except that heat treatment was not performed.

Comparative Example 5

An alloy coating steel plate was manufactured using the same method as in Comparative Example 4 above except that Mg was vacuum-coated to a thickness of 1.0 urn.

Comparative Example 6

An alloy coating steel plate was manufactured using the same method as in Comparative Example 4 above except that Mg was vacuum-coated to a thickness of 1.5 urn.

Comparative Example 7

An Al plating layer including 9 wt % of Si, 88 wt % of Al, and the balance of Fe was formed with a one-sided plating amount of 15 g/m² on a steel pate to prepare a fusion aluminum plating steel plate.

Comparative Example 8

An electrical zinc plating steel plate with a one-sided plating amount of 40 g/m² was prepared.

Comparative Example 9

A fusion zinc plating steel plate with a one-sided plating amount of 137.5 g/m² was prepared.

Comparative Example 10

An alloy coating steel plate was manufactured using the same method as in Example 5 above except that Mg was vacuum-coated to a thickness of 1.5 urn and heat-treated at 400° C. for 10 minutes and the Al plating layer including 00 wt % of Al and the balance of Fe, and not including Si was formed.

Comparative Example 11

An alloy coating steel plate was manufactured using the same method as in Example 5 above except that Mg was vacuum-coated to a thickness of 0.5 urn and heat-treated at 400° C. for 1 minute.

Comparative Example 12

An alloy coating steel plate was manufactured using the same method as in Example 5 above except that Mg was vacuum-coated to a thickness of 0.5 um and heat-treated at 400° C. for 20 minutes.

Comparative Example 13

An alloy coating steel plate was manufactured using the same method as in Example 5 above except that Mg was vacuum-coated to a thickness of 1.0 um and heat-treated at 400° C. for 1 minutes.

Comparative Example 14

An alloy coating steel plate was manufactured using the same method as in Example 5 above except that Mg was vacuum-coated to a thickness of 1.0 um and heat-treated at 400° C. for 20 minutes.

Comparative Example 15

An alloy coating steel plate was manufactured using the same method as in Example 5 above except that Mg was vacuum-coated to a thickness of 1.5 um and heat-treated at 400° C. for 1 minute.

Comparative Example 16

An alloy coating steel plate was manufactured using the same method as in Example 5 above except that Mg was vacuum-coated to a thickness of 1.5 um and heat-treated at 400° C. for 20 minutes.

Comparative Example 17

An alloy coating steel plate was manufactured using the same method as in Example 5 above except that Mg was vacuum-coated to a thickness of 1.5 urn and heat-treated at 450° C. for 20 minutes.

Information on specimens manufactured in Examples 5 to 16 above and Comparative Examples 4 to 17 above is shown in Table 3 below.

TABLE 3

| Division | Plating material | Plating amount (one side, g/m²) | Coating material | Coating thickness (um) | Heat treatment temperature (° C.) | Heat treatment time (min) |
|---|---|---|---|---|---|---|
| Example 5 | Al—Si | 15 | Mg | 0.5 | 375 | 10 |
| Example 6 | Al—Si | 15 | Mg | 1.0 | 375 | 10 |
| Example 7 | Al—Si | 15 | Mg | 1.5 | 375 | 10 |
| Comparative | Al—Si | 15 | Mg | 0.5 | No heat | — |

TABLE 3-continued

| Division | Plating material | Plating amount (one side, g/m²) | Coating material | Coating thickness (um) | Heat treatment temperature (° C.) | Heat treatment time (min) |
|---|---|---|---|---|---|---|
| Example 4 | | | | | treatment | |
| Example 8 | Al—Si | 15 | Mg | 0.5 | 400 | 2 |
| Example 9 | Al—Si | 15 | Mg | 0.5 | 400 | 5 |
| Example 10 | Al—Si | 15 | Mg | 0.5 | 400 | 10 |
| Comparative Example 5 | Al—Si | 15 | Mg | 1.0 | No heat treatment | — |
| Example 11 | Al—Si | 15 | Mg | 1.0 | 400 | 2 |
| Example 12 | Al—Si | 15 | Mg | 1.0 | 400 | 5 |
| Example 13 | Al—Si | 15 | Mg | 1.0 | 400 | 10 |
| Comparative Example 6 | Al—Si | 15 | Mg | 1.5 | No heat treatment | — |
| Example 14 | Al—Si | 15 | Mg | 1.5 | 400 | 2 |
| Example 15 | Al—Si | 15 | Mg | 1.5 | 400 | 5 |
| Example 16 | Al—Si | 15 | Mg | 1.5 | 400 | 10 |
| Comparative Example 7 | Al—Si | 15 | — | — | — | — |
| Comparative Example 8 | Zn | 40 | — | — | — | — |
| Comparative Example 9 | Zn | 137.5 | — | — | — | — |
| Comparative Example 10 | Al | 15 | Mg | 1.5 | 400 | 10 |
| Comparative Example 11 | Al—Si | 15 | Mg | 0.5 | 400 | 1 |
| Comparative Example 12 | Al—Si | 15 | Mg | 0.5 | 400 | 20 |
| Comparative Example 13 | Al—Si | 15 | Mg | 1.0 | 400 | 1 |
| Comparative Example 14 | Al—Si | 15 | Mg | 1.0 | 400 | 20 |
| Comparative Example 15 | Al—Si | 15 | Mg | 1.5 | 400 | 1 |
| Comparative Example 16 | Al—Si | 15 | Mg | 1.5 | 400 | 20 |
| Comparative Example 17 | Al—Si | 15 | Mg | 1.5 | 450 | 20 |

Experimental Example 6: Glow Discharge Light Spectroscopy Analysis

With regard to the alloy coating steel plates manufactured in Examples 6 and 7, components of a coating layer formed on a steel plate were analyzed using a glow discharge light spectroscopy (apparatus name: GDS 850A available from NECO).

Figure 15:
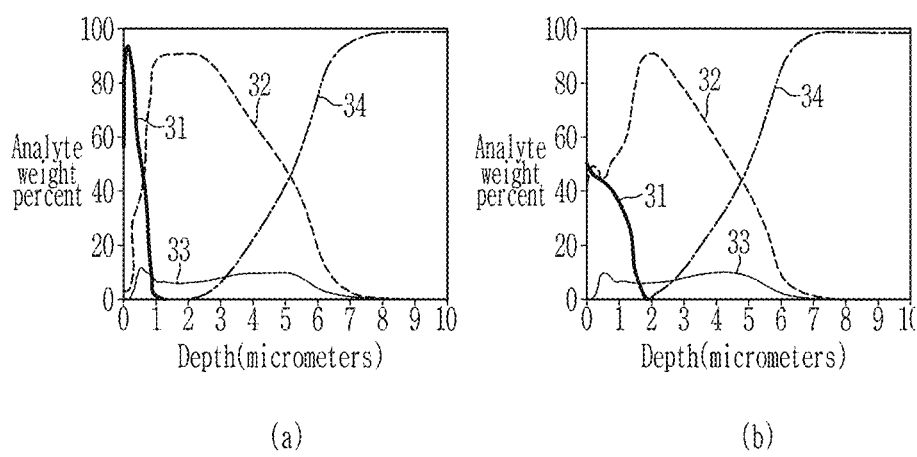
FIG. 15 is a glow discharge light spectroscopy (GDLS) analysis result graph of an alloy coating steel plate specimen of Examples 6 and 7 according to an exemplary embodiment of the present invention.

The result is shown in FIG. 15. In FIG. 15, 31 refers to Mg, 32 refers to Al, 33 refers to Si, and 34 refers to Fe.

FIG. 15A shows an analysis result of the alloy plating steel plate of Example 6 in which heat treatment is performed at 300° C. Therethrough, it is seen that Mg is present in a surface of the coating layer but a portion of Mg is diffused to an Al—Si alloy layer.

FIG. 15B shows an analysis result of the alloy plating steel plate of Example 7 in which heat treatment is performed at 375° C. Therethrough, it is seen that entire content of Mg coated on the fusion aluminum plating steel plate is diffused to the Al—Si alloy layer. However, it is seen that Mg is not diffused to an interface with the Al—Si—Fe alloy layer and the Al—Si alloy layer remains.

Experimental Example 7: XRD Analysis Result

Figure 16:
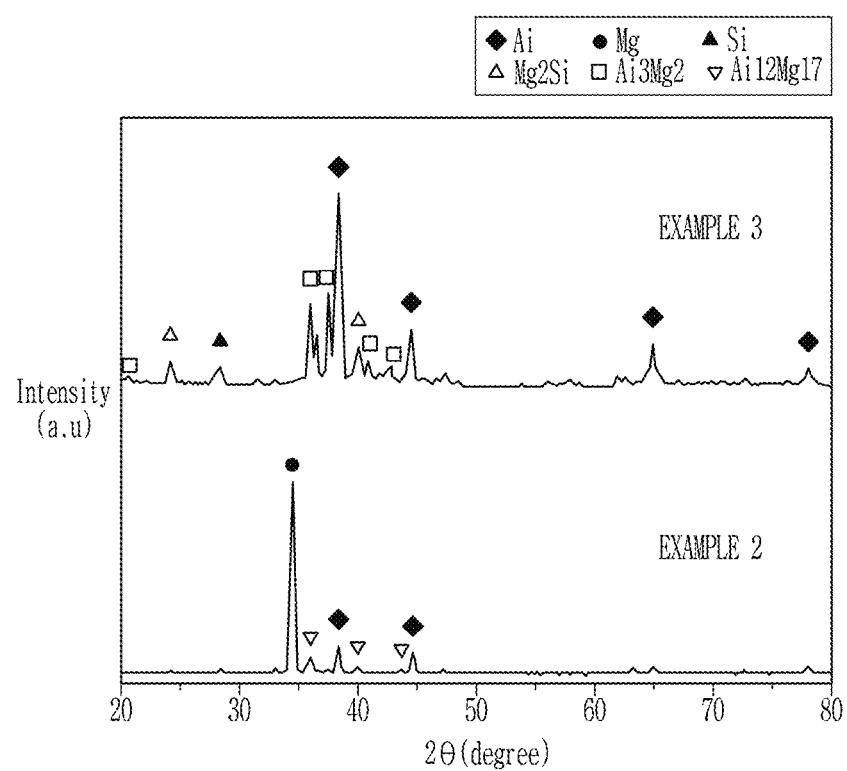
FIG. 16 is an X-ray diffraction (XRD) analysis result graph of Examples 6 and 7 according to an exemplary embodiment of the present invention.

XRD analysis was performed on the alloy coating steel plate manufactured in Examples 6 and 7 above using an X-Ray diffraction apparatus (apparatus name: D/MAX-2500V-PC available from Rigaku).
The analysis result is shown in FIG. 16.

As seen from Example 6 in which heat treatment is performed at 300° C., an Mg phase, an Al phase, and an $Al_{12}Mg_{17}$ phase coexist. Mg remains on an uppermost layer of a coating layer without change at a diffusion heat treatment temperature of 1500° C. and a portion of Mg is diffused to the Al—Si alloy layer and, thus, an Mg phase, an Al phase, and an $Al_{12}Mg_{17}$ phase produced when Mg content is higher than Al content is determined to be observed.

As seen from Example 7 in which heat treatment is performed at 375° C., an Mg phase is not observed and an Al phase, an $Al_3Mg_2$ phase, and an $Mg_2Si$ phase coexist. An Mg phase is not observed because entire content of Mg is determined to be diffused to the Al—Si alloy layer and, in addition, Si present in the Al—Si alloy layer reacts with Mg to provide an $Mg_2Si$ phase. When heat treatment is performed at 375° C., Mg is relatively deeply diffused to the Al—Si alloy layer and, thus, Mg content is lower than Al content and, accordingly, an $Al_{12}Mg_{17}$ phase produced when Mg content is high is removed and an $Al_3Mg_2$ phase is formed.

Experimental Example 8: Scanning Electron Microscope (SEM) Image Observation

Figure 17:
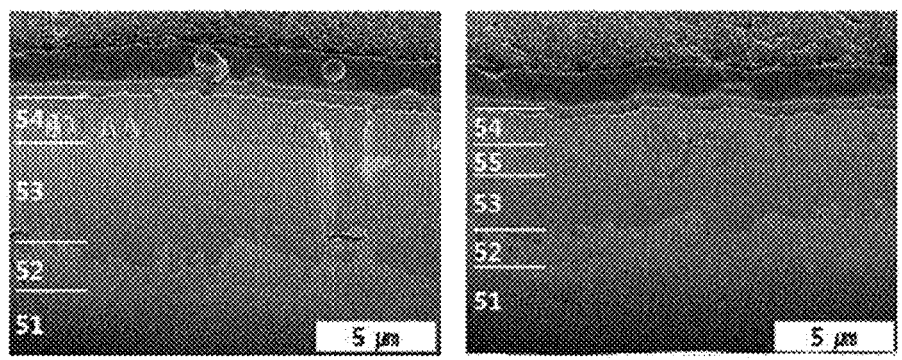
FIG. 17 is an SEM image before and after heat treatment of an alloy coating steel plate specimen of Example 7 according to an exemplary embodiment of the present invention.

FIG. 17 is an SEM image before and after heat treatment of a fusion aluminum plating steel plate with Mg coated thereon with 1 um.

FIG. 17A is an SEM image of a steel plate on which heat treatment is not performed, formed by coating Mg on a fusion aluminum plating steel plate and, in this case, the steel plate may be divided into a cold rolled steel plate 151, an Al—Fe—Si alloy layer 152, an Al—Si alloy layer 153, and an Mg coating layer 154.

FIG. 17B is an SEM image of Example 7 in which heat treatment is performed at 375° C. and, in this case, it is seen that an interface between the Mg coating layer 154 and the Al—Si alloy layer 153 is not clearly distinguished and Mg is diffused to an Al—Si alloy layer to form the Al—Mg—Si alloy layer 155.

Experimental Example 9: Anti-Corrosion Estimation

With regard to specimens of the steel plates of Examples 5 to 16 above Comparative Examples 4 to 17 above, anti-corrosion of a surface was estimated based on a time point of initially generating red rust using a salt spray test (ASTM B-117) method. The result is shown in Table 4 below.

more compared with the fusion aluminum plating steel plate of Comparative Example 7 in which Mg is not coated.

The Al—Mg coated steel sheet of Comparative Example 10 showed a significantly lower sacrifice-type characteristic compared to Example 16, which is an Al—Mg—Si coated steel sheet having the same coating thickness and heat treatment conditions. Through this, it can be seen that the Al—Mg—Si coated steel sheet including the $Mg_2Si$ phase and the $Al_3Mg_2$ phase has increased the sacrifice-type characteristic and thus improved anti-corrosion compared to the Al—Mg plated steel sheet. In addition, referring to Table 4, it can be seen that the appropriate heat treatment time is 2 to 10 minutes. Comparative Examples 11 to 17 out of the heat treatment time showed a lower sacrifice-type characteristic compared to the Examples having the heat treatment time at the same coating thickness and heat treatment temperature. In the case of heat treatment at 400° C. for 1 minute, the red rust generating time was not obtained in a tendency according to the coating thickness and showed an unstable value.

TABLE 4

| Division | Plating material | Plating amount (one side, g/m$^2$) | Coating material | coating thickness (μm) | Heat treatment temperature (° C.) | Heat treatment time (min) | Red rust generating time (hours) |
|---|---|---|---|---|---|---|---|
| Example 5 | Al—Si | 15 | Mg | 0.5 | 375 | 10 | 1536 |
| Example 6 | Al—Si | 15 | Mg | 1.0 | 375 | 10 | 1464 |
| Example 7 | Al—Si | 15 | Mg | 1.5 | 375 | 10 | 1536 |
| Comparative Example 4 | Al—Si | 15 | Mg | 0.5 | No heat treatment | — | 648 |
| Example 8 | Al—Si | 15 | Mg | 0.5 | 400 | 2 | 1008 |
| Example 9 | Al—Si | 15 | Mg | 0.5 | 400 | 5 | 1408 |
| Example 10 | Al—Si | 15 | Mg | 0.5 | 400 | 10 | 1264 |
| Comparative Example 5 | Al—Si | 15 | Mg | 1.0 | No heat treatment | — | 936 |
| Example 11 | Al—Si | 15 | Mg | 1.0 | 400 | 2 | 1488 |
| Example 12 | Al—Si | 15 | Mg | 1.0 | 400 | 5 | 2013 |
| Example 13 | Al—Si | 15 | Mg | 1.0 | 400 | 10 | 1848 |
| Comparative Example 6 | Al—Si | 15 | Mg | 1.5 | No heat treatment | — | 1128 |
| Example 14 | Al—Si | 15 | Mg | 1.5 | 400 | 2 | 2136 |
| Example 15 | Al—Si | 15 | Mg | 1.5 | 400 | 5 | 2320 |
| Example 16 | Al—Si | 15 | Mg | 1.5 | 400 | 10 | 2016 |
| Comparative Example 7 | Al—Si | 15 | — | — | — | — | 48 |
| Comparative Example 8 | Zn | 40 | — | — | — | — | 24 |
| Comparative Example 9 | Zn | 137.5 | — | — | — | — | 96 |
| Comparative Example 10 | Al | 15 | Mg | 1.5 | 400 | 10 | 528 |
| Comparative Example 11 | Al—Si | 15 | Mg | 0.5 | 400 | 1 | 696 |
| Comparative Example 12 | Al—Si | 15 | Mg | 0.5 | 400 | 20 | 672 |
| Comparative Example 13 | Al—Si | 15 | Mg | 1.0 | 400 | 1 | 432 |
| Comparative Example 14 | Al—Si | 15 | Mg | 1.0 | 400 | 20 | 1008 |
| Comparative Example 15 | Al—Si | 15 | Mg | 1.5 | 400 | 1 | 1176 |
| Comparative Example 16 | Al—Si | 15 | Mg | 1.5 | 400 | 20 | 1104 |
| Comparative Example 17 | Al—Si | 15 | Mg | 1.5 | 450 | 20 | 768 |

It is seen that an Al—Mg—Si coating steel plate on which heat treatment is performed is not largely changed according to a thickness of an Mg coating layer and red rust is generated in about 1008 to 2320 hours after a salt spray test is started. This shows improved anti-corrosion of 20 times or This is judged to be a phenomenon in which the heat treatment time is too short and the alloy layer formation occurs irregularly. In the case of heat treatment at 400° C. for 20 minutes, the red rust generating time was very similar to that of the case without heat treatment.

The coating layer is configured in such a way that an Al—Mg—Si alloy layer and an Al—Si alloy layer coexist and, when an Al phase, an Al$_3$Mg$_2$ phase, and an Mg$_2$Si phase are mixed at an appropriate ratio on a coating layer, it is seen that most excellent anti-corrosion is provided.

Experimental Example 10: Analysis of Distribution of Content of Mg in Coating Layer When a coating layer is analyzed using a glow discharge light spectroscopy, Mg content is numerically checked in an interface direction between the coating layer and the steel plate from a surface of the coating layer. As seen from glow discharge light spectroscope result of the coating layer of FIG. 15, most Mg is distributed in a pure Mg layer and Al—Mg layer in the coating layer with a three-layer structure except for an Al—Fe—Si layer. 90 wt % of Mg is distributed on a surface of a coating layer, which occupies about 20% of an entire thickness except for the Al—Fe—Si layer.

Average 40 wt % of Mg is distributed on a coating layer which occupies about 40% of an entire thickness of a coating layer with a two-layer structure except for the Al—Fe—Si layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 11: steel plate feeding device | |
| 12: inverse magnetron sputtering source | |
| 13: physical vapor deposition device | |
| 14: induction heating device | |
| 15: steel plate discharging device | 16: vacuum container |
| 17: fusion aluminum plating steel plate | 21: steel plate |
| 22: Al—Si—Fe alloy layer | 23: Al—Mg—Si alloy layer |
| 24: Al—Mg alloy phase | 25: Mg—Si alloy phase |
| 26: Al—Si alloy layer | 41: aluminum (Al) |
| 42: magnesium (Mg) | 43: silicon (Si) |
| 44. iron (Fe) | 51: cold rolled steel plate |
| 52: Al—Fe—Si alloy layer | 53: Al—Si alloy layer |
| 54: Mg layer | 55: Al—Mg—Si alloy layer |
| 111: steel plate feeding device | 112: inverse magnetron sputtering source |
| 113: physical vapor deposition device | |
| 114: induction heating device | |
| 115: steel plate discharging device | 116: vacuum container |
| 117: fusion aluminum plating steel plate | 120: cold rolled steel plate |
| 121: Al—Si—Fe alloy layer | 122: Al—Si alloy layer |
| 123: Al—Mg—Si alloy layer | 124: Mg coating layer |
| 125: fusion aluminum plating steel plate | 126: coating layer |
| 131: magnesium (Mg) | 132: aluminum (Al) |
| 133: silicon (Si) | 134: iron (Fe) |
| 151: cold rolled steel plate | 152: Al—Fe—Si alloy layer |
| 153: Al—Si alloy layer | 154: Mg coating layer |
| 155: Al—Mg—Si alloy layer | |

The invention claimed is:

1. An alloy coating steel plate comprising:
a steel plate;
an Al—Si—Fe alloy layer formed on the steel plate;
an Al—Si alloy layer formed on the Al—Si—Fe alloy layer;
an Al—Mg—Si alloy layer formed on the Al—Si alloy layer; and
a Mg layer or an Al—Mg alloy layer formed on the Al—Mg—Si alloy layer,
wherein the Al—Mg—Si alloy layer includes: an alloy layer formed of an Al—Mg alloy phase; and amorphous Mg—Si alloy grains inside the alloy layer,
wherein the Al—Mg alloy phase includes Al$_3$Mg$_2$,
wherein the amorphous Mg—Si alloy grains include Mg$_2$Si, and
wherein a content of the amorphous Mg—Si alloy grains is 1 wt % or more and 70 wt % or less based on a total weight of the Al—Mg—Si alloy layer.

2. The alloy coating steel plate of claim 1, wherein the Al—Mg—Si alloy layer has a gradient of Mg content, and the gradient of the Mg content decreases inward from a surface of the Al—Mg—Si alloy layer.

* * * * *